(12) United States Patent
Liu

(10) Patent No.: US 11,994,161 B2
(45) Date of Patent: May 28, 2024

(54) HINGE, DISPLAY MODULE AND ELECTRONIC DEVICE

(71) Applicant: BEIJING XIAOMI MOBILE SOFTWARE CO., LTD., Beijing (CN)

(72) Inventor: Jianwei Liu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 17/876,173

(22) Filed: Jul. 28, 2022

(65) Prior Publication Data

US 2023/0279898 A1    Sep. 7, 2023

(30) Foreign Application Priority Data

Mar. 7, 2022    (CN) .......................... 202210216544.6

(51) Int. Cl.
| | |
|---|---|
| H05K 5/00 | (2006.01) |
| F16C 11/04 | (2006.01) |
| H05K 5/02 | (2006.01) |
| E05D 3/12 | (2006.01) |
| E05D 3/18 | (2006.01) |

(52) U.S. Cl.
CPC ............ F16C 11/04 (2013.01); H05K 5/0018 (2022.08); H05K 5/0226 (2013.01); *E05D 3/122* (2013.01); *E05D 3/18* (2013.01); *E05Y 2900/606* (2013.01)

(58) Field of Classification Search
None
See application file for complete search history.

(56) References Cited

U.S. PATENT DOCUMENTS

| 10,895,894 B2 * | 1/2021 | Jan ........................ G06F 1/1652 |
| 2022/0137675 A1 * | 5/2022 | Kuramochi ........... G06F 1/1641 |
| | | 361/679.27 |

* cited by examiner

*Primary Examiner* — Anthony Q Edwards
*Assistant Examiner* — Rashen E Morrison
(74) *Attorney, Agent, or Firm* — COZEN O'CONNOR

(57) ABSTRACT

A hinge includes a base and a rotating component. The base extends along a first direction, and the rotating component includes a floating plate and a rotating assembly. A first mounting position and a second mounting position are on the floating plate and spaced apart along a second direction. The second direction is orthogonal to the first direction. A first end of the rotating assembly is pivotably coupled to the base, a second end of the rotating assembly is pivotably coupled to the first mounting position and the second mounting position. The rotating assembly is slidable relative to the second mounting position along the second direction.

19 Claims, 3 Drawing Sheets

HINGE, DISPLAY MODULE AND ELECTRONIC DEVICE

CROSS-REFERENCE TO RELATED APPLICATION

This application is based on and claims priority to Chinese Patent Application No. 202210216544.6 filed on Mar. 7, 2022, the entire contents of which are incorporated herein by reference.

BACKGROUND

With the development of flexible display technology, foldable electronic devices enjoy both the portability of ordinary electronic devices, and the large visual angle of large screen displays after being unfolded. Foldable electronic devices have become an important trend in the development of mobile terminals and an important area of competition among major terminal manufacturers. For the electronic devices having a folded state, hinge structures are very important, and the performance of the hinge structures will directly affect the function and experience of products.

In some foldable electronic devices, the screen is not flat when unfolded, which degrades user experience.

SUMMARY

The present disclosure relates to a field of electronic devices, and more particularly, to a hinge, a display module and an electronic device.

A hinge according to an embodiment of the present disclosure includes a base extending along a first direction; and a rotating component including a floating plate and a rotating assembly. A first end of the rotating assembly is pivotably coupled to the base, and a second end of the rotating assembly is pivotably coupled to a first mounting position and a second mounting position on the floating plate, the first mounting position and the second mounting position being spaced apart along a second direction that is orthogonal to the first direction. The rotating assembly is slidable relative to the second mounting position along the second direction.

A display module according to another embodiment of the present disclosure includes a screen and a hinge. The hinge includes a base extending along a first direction; and a rotating component including a floating plate and a rotating assembly. A first end of the rotating assembly is pivotably coupled to the base, and a second end of the rotating assembly is pivotably coupled to a first mounting position and a second mounting position on the floating plate, the first mounting position and the second mounting position being spaced apart along a second direction that is orthogonal to the first direction. The rotating assembly is slidable relative to the second mounting position along the second direction. The floating plate supports the screen.

An electronic device according to another embodiment of the present disclosure includes a hinge and a flexible display attached to the hinge. The hinge includes a base extending along a first direction; and a rotating component including a floating plate and a rotating assembly. A first end of the rotating assembly is pivotably coupled to the base, and a second end of the rotating assembly is pivotably coupled to a first mounting position and a second mounting position on the floating plate, the first mounting position and the second mounting position being spaced apart along a second direction that is orthogonal to the first direction. The rotating assembly is slidable relative to the second mounting position along the second direction.

DETAILED DESCRIPTION

Figure 1:
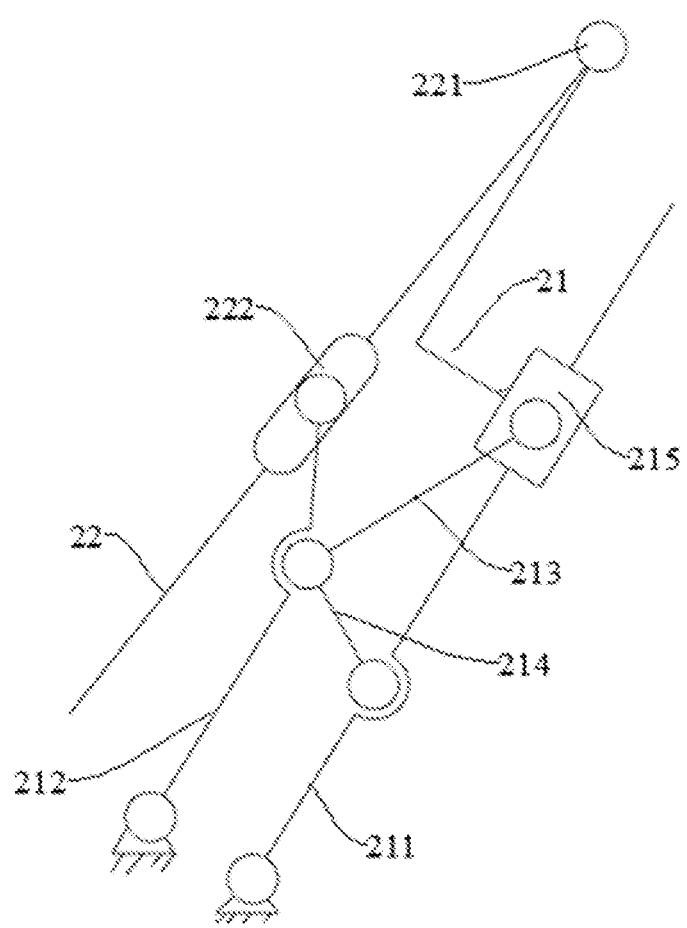
FIG. 1 is a schematic view of a hinge according to an embodiment of the present disclosure.

Embodiments of the present disclosure are described in detail below, and examples of the described embodiments are shown in accompanying drawings. The following embodiments described with reference to the accompanying drawings are exemplary and are intended to explain the present disclosure rather than limit the present disclosure.

A hinge, a display module, and an electronic device according to embodiments of the present disclosure will be described below with reference to FIGS. 1 to 4.

As shown in FIGS. 1 to 4, the hinge according to the embodiments of the present disclosure includes a base 1 and a rotating component 2, the base 1 extends along a first direction, and the rotating component 2 includes a floating plate 22 and a rotating assembly 21. A first mounting position 221 and a second mounting position 222 are on the floating plate 22 and spaced apart along a second direction orthogonal to the first direction. A first end of the rotating assembly 21 is pivotably coupled to the base 1, and a second end of the rotating assembly 21 is pivotably coupled to the first mounting position 221 and the second mounting position 222. The rotating assembly 21 is slidable relative to the second mounting position 222 along the second direction.

Figure 2:
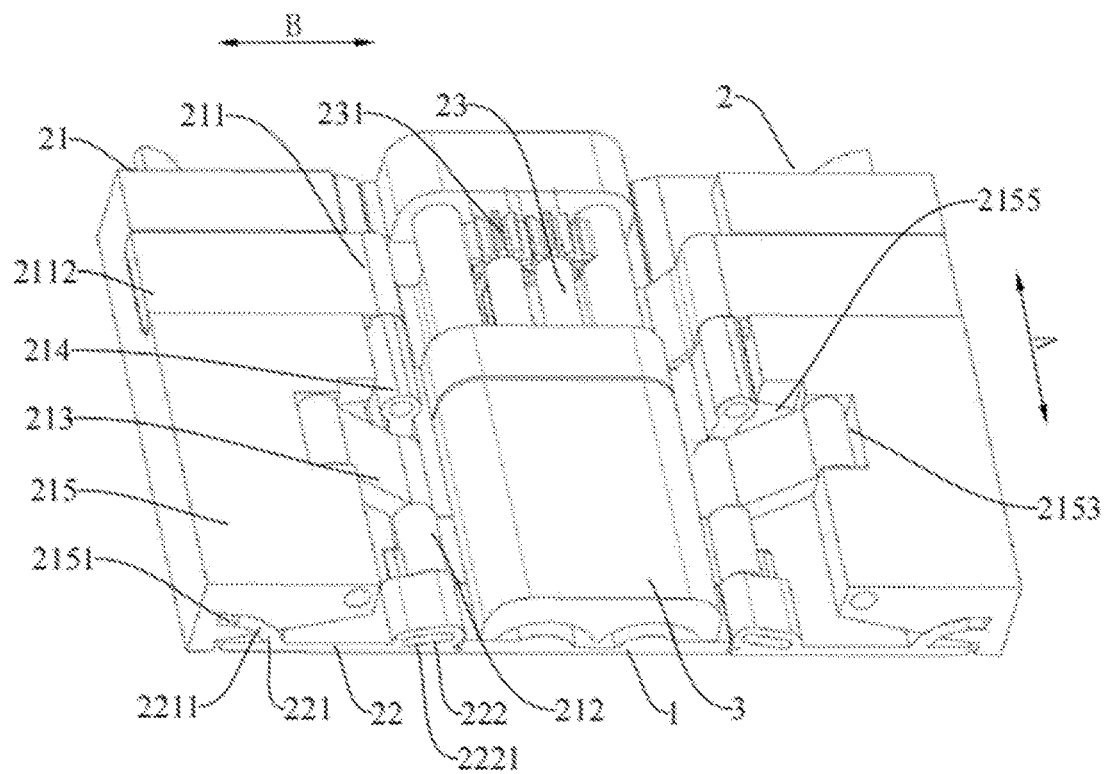
FIG. 2 is a schematic view of a hinge being unfolded according to an embodiment of the present disclosure.

It can be understood that the first direction is an A direction in FIG. 2, i.e., a length direction of the base 1, and the second direction is a B direction in FIG. 2, i.e., a width direction of the floating plate 22. When the hinge is folded, the floating plate 22 rotates about an axial direction of the first direction, and the second direction may always be orthogonal to the first direction. It should be noted that the first direction may be the length direction or a width direction of the base 1. The situation shown in FIG. 2 is merely an example and does not represent a limitation, and the embodiments of the present disclosure are not limited to the situation shown in FIG. 2.

For the hinge according to the embodiments of the present disclosure, the second end of the rotating assembly 21 is pivotably coupled to the first mounting position 221 and the second mounting position 222, and the rotating assembly 21 is slidable relative to the second mounting position 222 along the second direction, so that the display module or the electronic device using the hinge can better support a screen by the floating plate 22 when folded or unfolded, resulting in a better fit between the floating plate 22 and the screen and achieving higher flatness.

It can be understood that, as shown in FIGS. 1 to 4, the second mounting position 222 is closer to the base 1 than the first mounting position 221. When the rotating assembly 21 rotates about the first direction relative to the base 1, the rotating assembly 21 may rotate relative to the first mounting position 221 of the floating plate 22, and the rotating assembly 21 may not only rotate relative to the second mounting position 222 of the floating plate 22, but also slide relative to the second mounting position 222 along the second direction. Thus, the rotation of the floating plate 22 can better adapt to a natural bending shape of the screen. As a result, when the display module or the electronic device using the hinge is in a folded state or an unfolded state, the floating plate 22 may fully fit with the screen, and the hinge has a better fit with the screen, leading to higher flatness. In addition, a contour of the folded hinge exhibits a substantially teardrop shape, which can effectively support and protect the screen.

Figure 4:
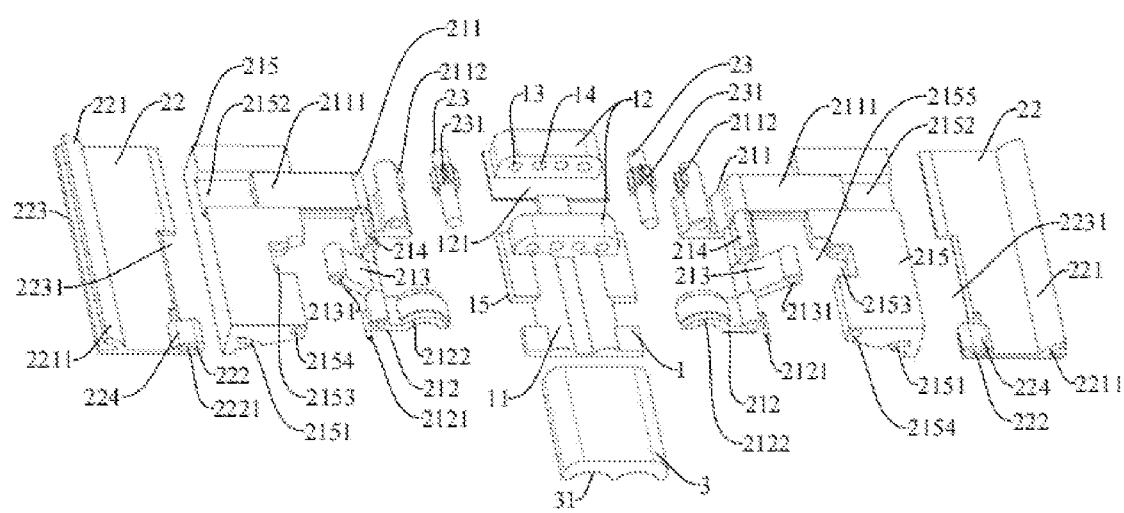
FIG. 4 is an exploded view of a hinge according to an embodiment of the present disclosure.

In some embodiments, as shown in FIGS. 1 and 4, the rotating assembly 21 includes a first rod 211, a second rod 212 and a connection member 215. The first rod 211 and the second rod 212 are arranged side by side on the base 1 and are rotatable relative to the base 1. The connection member 215 is slidable relative to the first rod 211. It can be understood that a pivot axis around which a first end of the first rod 211 pivots relative to the base 1 is in the same direction as the first direction; a width of the connection member 215 extends substantially along the second direction; and the first rod 211 slides relative to the second rod 212 along a width direction of the connection member 215. The connection member 215 is pivotably coupled to the first mounting position 221, so that the connection member 215 is rotatable relative to the floating plate 22. A first end of the second rod 212 is pivotably coupled to the base 1, and a second end of the second rod 212 is pivotably coupled to the second mounting position 222 and is slidable relative to the second mounting position 222. For the hinge according to the embodiments of the present disclosure, since the rotating assembly 21 is configured with the above structure, the hinge can achieve a simple structure, a reasonable design, a small number of parts, and lower production and manufacturing costs.

In some examples, as shown in FIGS. 1 and 4, the rotating assembly 21 further includes a third rod 213, a first end of the third rod 213 is pivotably coupled to the connection member 215, and a second end of the third rod 213 is pivotably coupled to the second rod 212. In the hinge according to the embodiments of the present disclosure, the arrangement of the third rod 213 a better linkage effect during the rotation of the second rod 212 and the connection member 215. In addition, a rotation trajectory of the floating plate 22 fits better with a bending trajectory of the screen when the hinge is folded or unfolded, improving a folding effect of the screen.

As shown in FIG. 4, the connection member 215 includes a first notch 2153, a first pivot hole 2154 is on a side of the first notch 2153 along the first direction, and a second pivot hole 2131 is in the first end of the third rod 213. The first end of the third rod 213 is in the first notch 2153. A first pivot member (not shown) is arranged in and passes through the first pivot hole 2154 and the second pivot hole 2131, so that the first end of the third rod 213 is pivotably coupled in the first notch 2153. For example, the first pivot member may be a pin shaft. The first pivot hole 2154 runs through two opposite sides of the first notch 2153. The first pivot member is detachably mounted in the first pivot hole 2154 and pivotably coupled to the second pivot hole 2131. In the hinge according to the embodiments of the present disclosure, the first end of the third rod 213 is fitted in the first notch 2153, resulting in a more compact structure and a reasonable layout design of the hinge structure.

In some examples, as shown in FIGS. 2 and 4, a first avoidance groove 2155 is at a position adjacent to the first notch 2153 and is configured to avoid the second mounting position 222 and the second rod 212. In the embodiments of the present disclosure, the arrangement of the first avoidance groove 2155 can avoid interference during the rotation of the floating plate 22 and the second rod 212 relative to the connection member 215, so that the hinge can rotate more smoothly and flexibly, and the hinge can achieve a more compact structure and a reasonable layout design.

In some examples, the first pivot hole 2154 is in communication with a side of the connection member 215 along the first direction. It can be understood that when the first pivot member is mounted, an end of the first pivot member may be inserted into the first pivot hole 2154 from the side of the connection member 215, which facilitates the assembly of the hinge and facilitates the processing and manufacturing.

In some examples, as shown in FIGS. 1 and 4, the rotating assembly 21 further includes a fourth rod 214, a first end of the fourth rod 214 is pivotably coupled to the first rod 211, and a second end of the fourth rod 214 is pivotably coupled to the second rod 212. In the hinge according to the embodiments of the present disclosure, the arrangement of the fourth rod 214 allows a better linkage effect during the rotation of the first rod 211 and the second rod 212. In addition, the rotation trajectory of the floating plate 22 fits better with the bending trajectory of the screen when the hinge is folded or unfolded, improving the folding effect of the screen.

In some examples, as shown in FIGS. 2 and 4, a pivot axis of the fourth rod 214 relative to the third rod 213 and a pivot axis of the third rod 213 relative to the second rod 212 are on a common axis and parallel to the first direction. For example, the second rod 212, the third rod 213 and the fourth rod 214 may be coupled in series through a common pin shaft, to enable the second rod 212, the third rod 213 and the fourth rod 214 to rotate around the same axis, so that the linkage effect of the hinge can be further improved. In addition, a mounting space between the first rod 211 and the second rod 212 can be effectively used to make a thickness of the hinge small, which is conducive to a lightweight and thin design of the whole device, thus improving user experience.

In some examples, as shown in FIGS. 2 and 4, the first rod 211, the fourth rod 214, the third rod 213 and the second rod 212 are arranged side by side in the first direction. It can be understood that the first rod 211, the fourth rod 214, the third rod 213 and the second rod 212 are arranged sequentially in the first direction. Alternatively, the third rod 213 may be on a side of the first rod 211 or the second rod 212 or may be between the first rod 211 and the second rod 212. In the hinge according to the embodiments of the present disclosure, relative positions of the first rod 211, the second rod 212, the third rod 213 and the fourth rod 214 may be adjusted according to actual needs, so that the hinge has a wider application range and a better support effect.

Figure 3:
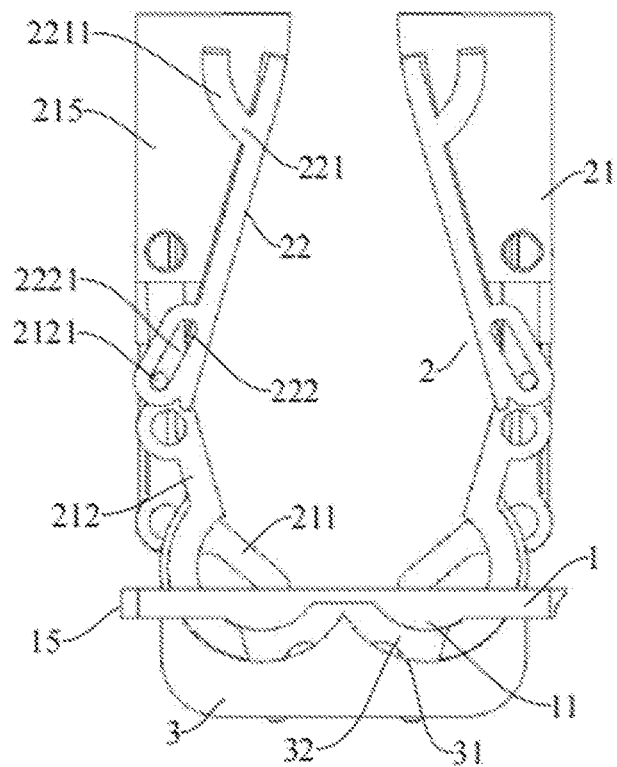
FIG. 3 is a schematic view of a hinge being folded according to an embodiment of the present disclosure.

In some examples, as shown in FIGS. 2 to 4, a first slide groove 2151 is in one of the connection member 215 and the first mounting position 221, and a first slide rail 2211 is on the other of the connection member 215 and the first mounting position 221. For example, the first slide groove 2151 is in the connection member 215, and the first slide rail 2211 is on the first mounting position 221. The first slide rail 2211 is slidably fitted with the first slide groove 2151, the first slide groove 2151 extends along a first arc line, and an axis of the first arc line is in the same direction as the first direction. The first slide rail 2211 is slidably fitted with the first slide groove 2151 along the first arc line, so that the connection member 215 is rotatable relative to the floating plate 22. It can be understood that when the hinge is folded, the connection member 215 rotates relative to the floating plate 22, so that the first slide rail 2211 slides into the first slide groove 2151 along the first arc line. When the hinge is unfolded, the connection member 215 rotates relative to the floating plate 22, so that part of the first slide rail 2211 gradually slides out of the first slide groove 2151 along the first arc line. As a result, the structure of connection between the connection member 215 and the floating plate 22 is reasonably designed and the reliability of connection is higher. In addition, the arrangement of the first slide rail 2211 and the first slide groove 2151 eliminates the need for any front opening in the floating plate 22, and improves the support effect of the floating plate 22 on the screen.

In some examples, as shown in FIGS. 2 to 4, a second slide groove 2152 is in one of the connection member 215 and the first rod 211, and a second slide rail 2111 is on the other of the connection member 215 and the first rod 211. For example, the second slide groove 2152 is in the connection member 215, and the second slide rail 2111 is on the first rod 211. It can be understood that the width of the connection member 215 generally extends along the second direction, and the second slide rail 2111 extends along the width direction of the connection member 215 and is slidably fitted with the second slide groove 2152. In the hinge according to the embodiments of the present disclosure, the arrangement of the second slide rail 2111 and the second slide groove 2152 makes the structure of connection between the connection member 215 and the first rod 211 more stable, and the structural design is simple, facilitating the processing and manufacturing and reducing production costs.

In some embodiments, as shown in FIGS. 2 to 4, a third slide hole 2221 is in one of the second rod 212 and the second mounting position 222, and a third slide rail 2121 is on the other of the second rod 212 and the second mounting position 222. For example, the third slide rail 2121 is on a side of the second rod 212 adjacent to the floating plate 22 and extends along the first direction. The third slide hole 2221 is formed in the second mounting position 222. An axial direction of the third slide hole 2221 is parallel to the first direction. The third slide rail 2121 is in a clearance fit with the third slide hole 2221, so that the third slide rail 2121 is slidable relative to the third slide hole 2221 along the second direction. In the hinge according to the embodiments of the present disclosure, the arrangement of the third slide rail 2121 and the third slide hole 2221 makes the structure of connection between the second rod 212 and the floating plate 22 more stable, and the structural design is simple, facilitating the processing and manufacturing and reducing production costs.

Specifically, as shown in FIGS. 2 and 4, the floating plate 22 includes a floating plate body 223, the first slide rail 2211, and a protrusion 224. The first slide rail 2211 is on a side of the floating plate body 223 facing away from the base 1, and the protrusion 224 is on a side of the floating plate body 223 adjacent to the base 1. The first slide rail 2211 constitutes the first mounting position 221, the third slide hole 2221 is in the protrusion 224, and the third slide hole 2221 constitutes the second mounting position 222. Moreover, the floating plate body 223 includes a second avoidance groove 2231 arranged side by side with the protrusion 224. The second avoidance groove 2231 is configured to avoid the second rod 212, the third rod 213 and the fourth rod 214. It can be understood that the interference during the rotation of the second rod 212, the third rod 213 and the fourth rod 214 relative to the floating plate 22 can be avoided by the second avoidance groove 2231, so that the hinge can rotate more smoothly and flexibly and achieve a more compact structure and a reasonable layout design.

In some embodiments, as shown in FIG. 4, the rotating assembly 21 further includes a gear transmission pair having a first meshing tooth 231, the first rod 211 has a second meshing tooth 2112, and the first meshing tooth 231 meshes with the second meshing tooth 2112 to drive the first rod 211 to rotate relative to the base 1. Since the hinge may drive the first rod 211 to swing by the gear transmission pair, the rotation of the rotating assembly 21 is more stable and more reliable.

In some examples, as shown in FIG. 4, the gear transmission pair includes a gear shaft 23, the gear shaft 23 has the first meshing tooth 231, and the gear shaft 23 is pivotably coupled to the base 1. In some examples, the gear transmission pair includes the gear shaft 23 and a transmission gear (not shown), and the gear shaft 23 meshes with the second meshing tooth 2112 of the first rod 211 through the transmission gear. For example, one or a plurality of transmission gears may be provided, and the plurality of transmission gears mesh with each other to transmit power.

In some examples, as shown in FIG. 4, the base 1 includes a second notch 121. A third pivot hole 13 and a fourth pivot hole 14 are on a side of the second notch 121 along the first direction. The first end of the first rod 211 is pivotably fitted in the third pivot hole 13, and an end of the gear shaft 23 is pivotably fitted in the fourth pivot hole 14. It can be understood that the third pivot hole 13 and the fourth pivot hole 14 may be arranged side by side, the first end of the first rod 211 may be detachably coupled to the third pivot hole 13, and the end of the gear shaft 23 may be detachably coupled to the fourth pivot hole 14. As a result, the connection structure of the hinge can be more stable, and the production and assembly can be facilitated.

In some examples, as shown in FIG. 4, two first mounting portions 12 are on the base 1 and spaced apart along the first direction. For example, the first mounting portion 12 may be of a convex block structure. The second notch 121 is defined between the two first mounting portions 12, and the third pivot hole 13 and the fourth pivot hole 14 are in the first mounting portions 12, so that the structure of the base 1 can be more reasonable, enhancing the structural strength, and facilitates the processing and manufacturing.

In some embodiments, as shown in FIGS. 2 to 4, two groups of rotating components 2 are provided, and the two groups of rotating components 2 are pivotably coupled to two sides of the base 1. It can be understood that the two rotating components 2 may be unfolded and closed with the base 1 as a center. In an unfolded state, the two rotating components 2 and the base 1 between the two rotating components 2 form a plane. In a closed state, since the inside of the rotating components 2 may also rotate, the rotating components 2 may be completely closed, presenting a teardrop-shaped section after being closed.

As shown in FIGS. 2 to 4, the base 1 may be in the shape of a column, a plate shape or other shapes. The rotation connection between the base 1 and the rotating component 2 may be realized by a pivot connection or a hinge connection, or by sliding along an arc-shaped sliding path. The present disclosure is not limited thereto.

Specifically, as shown in FIGS. 2 and 4, the rotating assembly 21 of each group of rotating components 2 includes the gear shaft 23, and two gear shafts 23 are on two sides of the base 1 and are rotatable relative to the base 1. Each gear shaft 23 has the first meshing tooth 231, the first rod 211 has the second meshing tooth 2112, the first meshing tooth 231 meshes with the second meshing tooth 2112. First meshing teeth 231 of the two gear shafts 23 mesh with each other. It can be understood that one of the two gear shafts 23 is coupled to a drive motor (not shown). Since the first meshing teeth 231 of the two gear shafts 23 mesh with each other, the drive motor may drive the gear shafts 23 to rotate, and the two gear shafts 23 rotate synchronously to drive the rotating assemblies 21 on two sides of the base 1 to unfold or close synchronously.

In some embodiments, as shown in FIGS. 2 to 4, the hinge according to the embodiments of the present disclosure further includes a cover body 3 on a lower end of the base 1. For example, the cover body 3 includes an avoidance structure corresponding to a mounting structure on the base 1, so that a pivot position of the base 1 and the rotating assembly 21 may be covered, improving the reliability of the hinge in use.

In some examples, as shown in FIG. 4, an arc-shaped recess 2122 is in one of the second rod 212 and the base 1, an arc-shaped shaft portion 11 is on the other of the second rod 212 and the base 1, and the arc-shaped recess 2122 is pivotably coupled to the arc-shaped shaft portion 11. For example, the base 1 includes a base body 15 and the arc-shaped shaft portion 11. Two arc-shaped shaft portions 11 are provided and are arranged side by side and spaced apart along the width direction of the base 1. The base body 15 and the arc-shaped shaft portion 11 are integrally formed. The arc-shaped recess 2122 is in the second rod 212 and has an arc-shaped concave surface. The arc-shaped concave surface is fitted with the arc-shaped shaft portion 11 and is rotatable relative to the arc-shaped shaft portion. Therefore, in the hinge according to the embodiments of the present disclosure, the arrangement of the arc-shaped recess 2122 and the arc-shaped shaft portion 11 allows fewer parts during the assembly of the hinge, a reasonable structural design and good practicability.

Specifically, as shown in FIGS. 3 and 4, the cover body 3 includes a third avoidance groove 31, and the third avoidance groove 31 is on a side of the cover body 3 adjacent to the base 1. Two third avoidance grooves 31 are provided, and the two third avoidance grooves 31 are spaced apart and in one-to-one correspondence with the two arc-shaped shaft portions 11. An arc-shaped accommodation cavity 32 is defined between the third avoidance grooves 31 and the arc-shaped shaft portions 11, and the arc-shaped recess 2122 may rotate in the arc-shaped accommodation cavity 32. Thus, the second rod 212 can rotate more smoothly relative to the base 1, the number of used parts can be reduced, the structural design is compact, and the layout is reasonable.

A display module according to another embodiment of the present disclosure includes a screen and the hinge that is a hinge according to the embodiments of the present disclosure, and the floating plate 22 supports the screen. It can be understood that the screen is on upper ends of the floating plate 22 and the base 1, and fits with the floating plate 22 and the base 1. In other words, a rear surface of the screen is coupled to an inner side of the hinge, and the screen may be folded and unfolded as the hinge is opened and closed.

An electronic device according to still another embodiment of the present disclosure includes the hinge according to the embodiments of the present disclosure or the display module according to the embodiments of the present disclosure.

For the display module and the electronic device having the display module according to the embodiments of the present disclosure, the screen may be supported by the floating plate 22. Since the second end of the rotating assembly 21 is pivotably coupled to the first mounting position 221 and the second mounting position 222 and the rotating assembly 21 is slidable relative to the second mounting position 222 along the second direction, the screen may be better supported by the floating plate 22 when the display module is folded or unfolded, so that the floating plate 22 has a better fit with the screen, resulting in higher flatness.

In addition, the rotating assembly 21 of the hinge according to the embodiments of the present disclosure includes a plurality of linkage members, so that the hinge can have good stability during use, a reliable connection structure, fewer parts, and lower production and manufacturing costs. Moreover, when the display module and the electronic device having the hinge are in the folded state, the contour of the hinge exhibits the substantially teardrop shape, effectively supporting and protecting the screen, and the thickness of the whole device is small, which is conducive to realizing the lightweight and thin design of the electronic device and improving the user experience.

In the description of the present disclosure, it shall be understood that terms such as "central," "longitudinal," "transverse," "length," "width," "thickness," "upper," "lower," "front," "rear," "left," "right," "vertical," "horizontal," "top," "bottom," "inner," "outer," "clockwise," "counterclockwise," "axial," "radial" and "circumferential" should be construed to refer to the orientation as then described or as shown in the drawings under discussion. These relative terms are for convenience of description and do not indicate or imply that the device or element referred to must have a particular orientation, or be constructed and operated in a particular orientation. Thus, these terms shall not be construed as limitation on the present disclosure.

In addition, terms such as "first" and "second" are merely used for descriptive purposes and cannot be understood as indicating or implying relative importance or the number of technical features indicated. Thus, the features associated with "first" and "second" may explicitly or implicitly include at least one of the features. In the description of the present disclosure, unless otherwise specifically defined, "a plurality of" means at least two, such as two, three, etc.

In the present disclosure, unless otherwise explicitly specified and defined, the terms "mounted," "coupled," "connected," "fixed" and the like are used broadly, and may be, for example, fixed connections, detachable connections, or integral connections; may also be mechanical or electrical connections or intercommunication; may also be direct connections or indirect connections via intermediate media; may also be inner communications or interactions of two elements. For those skilled in the art, the specific meaning of the above terms in the present disclosure can be understood according to the specific circumstances.

In the present disclosure, unless otherwise explicitly specified and defined, a structure in which a first feature is "on" or "below" a second feature may include an embodiment in which the first feature is in direct contact with the second feature, and may also include an embodiment in which the first feature and the second feature are not in direct contact with each other, but are contacted via an intermediate medium formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

In the present disclosure, terms such as "an embodiment," "some embodiments," "an example," "a specific example," or "some examples," means that a particular feature, structure, material, or characteristic described in connection with the embodiment or example is included in at least one embodiment or example of the present disclosure. Thus, the appearances of these terms in various places throughout this specification are not necessarily referring to the same embodiment or example of the present disclosure. Furthermore, the particular features, structures, materials, or characteristics may be combined in any suitable manner in one or more embodiments or examples. In addition, without contradiction, those skilled in the art may combine and unite different embodiments or examples or features of the different embodiments or examples described in this specification.

Although the above embodiments have been shown and described, it can be understood that the above embodiments are exemplary and shall not be understood as limitation to the present disclosure, and changes, modifications, alternatives and variations can be made in the above embodiments within the scope of the present disclosure.

What is claimed is:

1. A hinge, comprising:
a base extending along a first direction; and
a rotating component comprising a floating plate and a rotating assembly,
wherein:
a first end of the rotating assembly is pivotably coupled to the base, and a second end of the rotating assembly is pivotably coupled to a first mounting position and a second mounting position on the floating plate, the first mounting position and the second mounting position being spaced apart along a second direction that is orthogonal to the first direction;
the rotating assembly is slidable relative to the second mounting position along the second direction;
the rotating assembly comprises a first rod, a second rod, a third rod, and a connection member;
a first end of the first rod is pivotably coupled to the base, and a first end of the second rod is pivotably coupled to the base;
the connection member is slidable relative to the first rod; and
a first end of the third rod is pivotably coupled to the connection member, and a second end of the third rod is pivotably coupled to the second rod.

2. The hinge according to claim 1, wherein:
connection member is pivotably coupled to the first mounting position; and
a second end of the second rod is pivotably coupled to the second mounting position and is slidable relative to the second mounting position.

3. The hinge according to claim 1, wherein:
a first notch is in the connection member, a first pivot hole is on a side of the first notch along the first direction, and a second pivot hole is in the first end of the third rod; and
a first pivot member is inserted in and passes through the first pivot hole and the second pivot hole, and the first notch is pivotably coupled to the first end of the third rod.

4. The hinge according to claim 3, wherein the first pivot hole is in communication with a side of the connection member along the first direction.

5. The hinge according to claim 2, wherein the rotating assembly further comprises a fourth rod, a first end of the fourth rod being pivotably coupled to the first rod, and a second end of the fourth rod being pivotably coupled to the second rod.

6. The hinge according to claim 1, wherein:
the rotating assembly further comprises a fourth rod, a first end of the fourth rod being pivotably coupled to the first rod, and a second end of the fourth rod being pivotably coupled to the second end of the third rod; and
a pivot axis of the fourth rod relative to the third rod and a pivot axis of the third rod relative to the second rod are on a common axis and parallel to the first direction.

7. The hinge according to claim 5, wherein the first rod, the fourth rod, the third rod and the second rod are arranged side by side along the first direction.

8. The hinge according to claim 2, wherein:
a first slide groove is in one of the connection member and the first mounting position, a first slide rail is on the other of the connection member and the first mounting position, and the first slide rail is fitted with the first slide groove; and
the first slide groove extends along a first arc line, an axis of the first arc line is in a same direction as the first direction, and the first slide rail is slidably fitted with the first slide groove along the first arc line, allowing the connection member to rotate relative to the floating plate.

9. The hinge according to claim 2, wherein a second slide groove is in one of the connection member and the first rod, a second slide rail is on the other of the connection member and the first rod, and the second slide rail is slidably fitted with the second slide groove in a direction orthogonal to the first direction.

10. The hinge according to claim 2, wherein a third slide hole is in one of the second rod and the second mounting position, a third slide rail is on the other of the second rod and the second mounting position, and the third slide rail is pivotably coupled to the third slide hole and slidably fitted with the third slide hole along the second direction.

11. The hinge according to claim 10, wherein the third slide rail is on a side of the second rod adjacent to the floating plate and extends along the first direction, the third slide hole is formed in the second mounting position, and an axial direction of the third slide hole is parallel to the first direction.

12. The hinge according to claim 2, wherein an arc-shaped recess is in one of the second rod and the base, an arc-shaped shaft portion is on the other of the second rod and the base, and the arc-shaped recess is pivotably coupled to the arc-shaped shaft portion.

13. The hinge according to claim 2, wherein the rotating assembly further comprises a gear transmission pair having a first meshing tooth, the first rod has a second meshing tooth, and the first meshing tooth meshes with the second meshing tooth to drive the first rod to rotate relative to the base.

14. The hinge according to claim 13, wherein the gear transmission pair comprises a gear shaft, the first meshing tooth is on the gear shaft, and the gear shaft is pivotably coupled to the base.

15. The hinge according to claim 14, wherein the base comprises a second notch, a third pivot hole and a fourth pivot hole are on a side of the second notch along the first direction, the first end of the first rod is pivotably fitted in the third pivot hole, and an end of the gear shaft is pivotably fitted in the fourth pivot hole.

16. The hinge according to claim 15, wherein two first mounting portions are on the base and spaced apart along the first direction, the second notch is defined between the two first mounting portions, and the third pivot hole and the fourth pivot hole are in the first mounting portions.

17. The hinge according to claim 1, further comprising two groups of rotating components pivotably coupled to two sides of the base correspondingly.

18. A display module, comprising:
a screen; and
a hinge,
wherein:
the hinge comprises a base extending along a first direction; and a rotating component comprising a floating plate and a rotating assembly;
a first end of the rotating assembly is pivotably coupled to the base, and a second end of the rotating assembly is pivotably coupled to a first mounting position and a second mounting position on the floating plate, the first mounting position and the second mounting position being spaced apart along a second direction that is orthogonal to the first direction;
the rotating assembly is slidable relative to the second mounting position along the second direction;
the floating plate supports the screen;
the rotating assembly comprises a first rod, a second rod, a third rod, and a connection member;
a first end of the first rod is pivotably coupled to the base, and a first end of the second rod is pivotably coupled to the base;
the connection member is slidable relative to the first rod; and
a first end of the third rod is pivotably coupled to the connection member, and a second end of the third rod is pivotably coupled to the second rod.

19. An electronic device, comprising:
a hinge; and
a flexible display attached to the hinge,
wherein:
the hinge comprises a base extending along a first direction; and a rotating component comprising a floating plate and a rotating assembly;
a first end of the rotating assembly is pivotably coupled to the base, and a second end of the rotating assembly is pivotably coupled to a first mounting position and a second mounting position on the floating plate, the first mounting position and the second mounting position being spaced apart along a second direction that is orthogonal to the first direction;
the rotating assembly is slidable relative to the second mounting position along the second direction;
the rotating assembly comprises a first rod, a second rod, a third rod, and a connection member;
a first end of the first rod is pivotably coupled to the base, and a first end of the second rod is pivotably coupled to the base;
the connection member is slidable relative to the first rod; and
a first end of the third rod is pivotably coupled to the connection member, and a second end of the third rod is pivotably coupled to the second rod.

\* \* \* \* \*